US010424697B2

(12) United States Patent
Oh et al.

(10) Patent No.: US 10,424,697 B2
(45) Date of Patent: Sep. 24, 2019

(54) LIGHT EMITTING DIODE PACKAGE AND MANUFACTURING METHOD THEREOF

(71) Applicant: Seoul Semiconductor Co., Ltd., Ansan-si (KR)

(72) Inventors: Kwang Yong Oh, Ansan-si (KR); Ho Jun Byun, Ansan-si (KR); Hyuck Jun Kim, Ansan-si (KR); Ki Bum Nam, Ansan-si (KR); Su Yeon Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/371,774

(22) Filed: Apr. 1, 2019

(65) Prior Publication Data

US 2019/0237636 A1     Aug. 1, 2019

Related U.S. Application Data

(63) Continuation of application No. 15/645,632, filed on Jul. 10, 2017, now Pat. No. 10,249,801, which is a (Continued)

(30) Foreign Application Priority Data

Aug. 18, 2014    (KR) .................. 10-2014-0106769
Aug. 27, 2014    (KR) .................. 10-2014-0112542
May 29, 2015    (KR) .................. 10-2015-0076499

(51) Int. Cl.
     *H01L 33/50*         (2010.01)
     *C09K 11/77*        (2006.01)
     (Continued)

(52) U.S. Cl.
     CPC .......... *H01L 33/504* (2013.01); *C09K 11/616* (2013.01); *C09K 11/7734* (2013.01);
     (Continued)

(58) Field of Classification Search
None
See application file for complete search history.

(56) References Cited

U.S. PATENT DOCUMENTS 7,497,973 B2    3/2009   Radkov et al.
8,269,410 B2    9/2012   Kijima et al.
(Continued)

FOREIGN PATENT DOCUMENTS

EP          2629341       8/2013
JP       2010-209311     9/2010
(Continued)

OTHER PUBLICATIONS

European Search Report dated Jan. 19, 2016 in European Application No. 15180388.9.
(Continued)

*Primary Examiner* — Thien F Tran
(74) *Attorney, Agent, or Firm* — H.C. Park & Associates, PLC

(57) ABSTRACT

A light-emitting diode package includes a light-emitting diode chip disposed in a housing, a first phosphor configured to emit green light, and a second phosphor configured to emit red light. White light is configured to be formed by a synthesis of light emitted from the light-emitting diode chip, the first phosphor, and the second phosphor. The second phosphor has a chemical formula of $A_2MF_6:Mn^{4+}$, A is one of Li, Na, K, Rb, Ce, and $NH_4$, and M is one of Si, Ti, Nb, and Ta, and the $Mn^{4+}$ of the second phosphor has a mole range of about 0.02 to about 0.035 times the M.

17 Claims, 9 Drawing Sheets

Related U.S. Application Data continuation of application No. 14/828,937, filed on Aug. 18, 2015, now Pat. No. 9,741,907.

(51) Int. Cl.
    *H01L 33/48*     (2010.01)
    *C09K 11/61*     (2006.01)
    *C09K 11/88*     (2006.01)

(52) U.S. Cl.
    CPC .......... *C09K 11/883* (2013.01); *H01L 33/486* (2013.01); *Y02B 20/181* (2013.01)

(56) References Cited

U.S. PATENT DOCUMENTS

| | | | |
|---|---|---|---|
| 2006/0071589 A1 | 4/2006 | Radkov | |
| 2006/0169998 A1 | 8/2006 | Radkov et al. | |
| 2007/0182887 A1* | 8/2007 | Haga | G02F 1/133603 349/106 |
| 2009/0020775 A1 | 1/2009 | Radkov et al. | |
| 2011/0089453 A1* | 4/2011 | Min | F21V 5/04 257/98 |
| 2012/0003904 A1 | 1/2012 | Schmitz | |
| 2012/0039064 A1 | 2/2012 | Ooyabu et al. | |
| 2013/0002963 A1 | 1/2013 | Yokota | |
| 2013/0264937 A1 | 10/2013 | Sakuta et al. | |
| 2014/0145225 A1 | 5/2014 | Wu et al. | |
| 2014/0327026 A1 | 11/2014 | Murphy et al. | |
| 2016/0154276 A1* | 6/2016 | Saitoh | G02B 5/201 349/61 |

FOREIGN PATENT DOCUMENTS

| | | |
|---|---|---|
| JP | 2012-104814 | 5/2012 |
| KR | 10-2004-0032456 | 4/2004 |
| KR | 10-0961324 | 11/2004 |

OTHER PUBLICATIONS

Wei-Ren Liu1, et al., "Luminescence Properties of Green-emitting Phosphors-Sr4Al14O25:Eu2+ for LED Applications", Chem, Chem., Eng.5, Jul. 10, 2011, pp. 638-643.
Definition of "Phosphor" from Wikipedia, the free encyclopedia, obtaining from https://en.wikipedia.org/wiki/Phosphor.
Uses of "Luminance and Chromaticity" in practical application, found in Color Usage Research Lab of Nasa Ames, Research Center (http://colorusage.arc.nasa.gov/lum_and_chrom.php).
Japanese Office Action dated Jul. 1, 2016 in Japanese Patent Application No. 2015-161386 with Machine Translation.
Non-Final Office Action dated Feb. 25, 2016 in U.S. Appl. No. 14/828,937.
Non-Final Office Action dated Sep. 30, 2016 in U.S. Appl. No. 14/828,937.
Notice of Allowance dated Apr. 27, 2017 in U.S. Appl. No. 14/828,937.
Non-Final Office Action dated Apr. 2, 2018 in U.S. Appl. No. 15/645,632.
Final Office Action dated Sep. 10, 2018 in U.S. Appl. No. 15/645,632.
Notice of Allowance dated Nov. 20, 2018 in U.S. Appl. No. 15/645,632.

\* cited by examiner

LIGHT EMITTING DIODE PACKAGE AND MANUFACTURING METHOD THEREOF

CROSS-REFERENCE TO RELATED APPLICATIONS

This application is a Continuation of U.S. patent application Ser. No. 15/645,632, filed on Jul. 10, 2017, which is a Continuation of U.S. patent application Ser. No. 14/828, 937, filed on Aug. 18, 2015, and claims priority from and the benefit of Korean Patent Application No. 10-2014-0106769, filed on Aug. 18, 2014, Korean Patent Application No. 10-2014-0112542, filed on Aug. 27, 2014, and Korean Patent Application No. 10-2015-0076499, filed on May 29, 2015, which all are hereby incorporated by reference for all purposes as if fully set forth herein.

BACKGROUND

Field

Exemplary embodiments relate to a light emitting diode package and a manufacturing method of a light emitting diode package. More particularly, exemplary embodiments relate to a light emitting diode package including a phosphor and a manufacturing method of a light emitting diode package including a phosphor.

Discussion of the Background

A light-emitting diode (LED) package is referred to as a device that emits light by recombining electrons and holes across a p-n junction. The LED package may have low power consumption and long lifespan and may be manufactured in a small size compared to incandescent light.

The LED package may implement white light by using phosphor as a wavelength conversion means as a yellow light-emitting phosphor, a green light-emitting phosphor, or a red light-emitting phosphor. However, a white LED package using yellow light-emitting phosphor may have low color rendering due to spectrum deficiency of green and red zones of the emitted light. In particular, when the white LED package is used as a backlight unit, it may be difficult to implement a natural color due to low color purity after light is transmitted through a color filter. An LED package using green and red light-emitting phosphors has a full width at half maximum (FWHM) wider than that of the light-emitting diode chip. In particular, nitride phosphor has a wide FWHM in a red wavelength zone. The light having the wide FWHM has reduced color reproduction. Thus, it may be difficult to implement the desired color coordinates in the display with a wide FWHM. Accordingly, a yellow light-emitting phosphor, a green light-emitting phosphor, or a red light-emitting phosphor may be unreliable.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a light emitting diode package having enhanced reliability and a manufacturing method thereof.

Exemplary embodiments provide a light emitting diode package including a phosphor that is stabilized against moisture and heat and a manufacturing method thereof.

Additional aspects will be set forth in the detailed description which follows, and, in part, will be apparent from the disclosure, or may be learned by practice of the inventive concept.

An exemplary embodiment discloses a light-emitting diode package including a light emitting diode chip disposed in a housing, a first phosphor configured to emit green light, and a second phosphor configured to emit red light. White light is configured to be formed by a synthesis of light emitted from the light emitting diode chip, the first phosphor, and the second phosphor. The second phosphor has a chemical formula of $A_2MF_6:Mn^{4+}$, A is one of Li, Na, K, Rb, Ce, and NH4, M is one of Si, Ti, Nb, and Ta, and $Mn^{4+}$ of the second phosphor has a molar range of about 0.02 to about 0.035 times M.

The white light may have an x color coordinate and a y color coordinate forming a point present in a region on a CIE chromaticity diagram. The x color coordinate is about 0.25 to about 0.32 and the y color coordinate is 0.22 to 0.32.

The light-emitting diode package may include a change rate of a light emitting intensity of the white light is about 5% or less.

A size of a peak wavelength of the green light may be about 20% to about 35% of a peak wavelength of the red light.

The first phosphor may be at least one of a BAM-based phosphor and a quantum dot phosphor.

A peak wavelength of the green light of the first phosphor may include a range from about 520 nm to 570 nm. A peak wavelength of the red light of the second phosphor comprises a range from about 610 nm to about 650 nm.

The light emitting diode chip may include at least one of a blue light emitting diode chip and an ultraviolet light emitting diode chip.

The white light may have a national television system committee (NTSC) color saturation which is more than or equal to about 85%.

The red light emitted from the second phosphor may have a full width at half maximum (FWHM) less than or equal to about 15 nm.

An exemplary embodiment also discloses a light-emitting diode package including a light emitting diode chip disposed in a housing, a first phosphor configured to emit green light, and a second phosphor and a third phosphor configured to emit red light. The second phosphor has a chemical formula of $A_2MF_6:Mn^{4+}$, the A is one of Li, Na, K, Ba, Rb, Cs, Mg, Ca, Se, and Zn and the M is one of Ti, Si, Zr, Sn, and Ge.

The third phosphor may be a nitride-based phosphor and the red light of the second phosphor and the red light of the third phosphor have different peak wavelengths. The third phosphor may have a mass range of about 0.1 wt % to about 10 wt % with respect to the second phosphor.

A first peak wavelength of the green light of the first phosphor may include a first range from about 500 nm to about 570 nm. A peak wavelength of the red light of the second phosphor may include a range from about 610 nm to about 650 nm. A peak wavelength of the red light of the third phosphor may include a range from about 600 nm to about 670 nm.

The third phosphor may include at least one of $MSiN_2$, $MSiON_2$, and $M_2Si_5N_8$ and M is one of Ca, Sr, Ba, Zn, Mg, and Eu.

The second phosphor may have a full width at half maximum (FWHM) smaller than that of the third phosphor.

The first phosphor may include at least one of a Ba—Al—Mg (BAM)-based phosphor, a quantum dot phosphor, a silicate-based phosphor, a beta-SiAlON-based phosphor, a Garnet-based phosphor, and an LSN-based phosphor.

The light emitting diode chip may include at least one of a blue light emitting diode chip and an ultraviolet light emitting diode chip.

White light may be formed by a synthesis of light emitted from the light emitting diode chip, the first phosphor, the second phosphor, and the third phosphor. The white light may include a national television system committee (NTSC) color saturation which is more than or equal to about 85%.

The white light may include an x color coordinate and a y color coordinate forming a point which is present within a region on a CIE chromaticity diagram. The x color coordinate may be about 0.25 to about 0.35 and the y color coordinate may be about 0.22 to about 0.32.

When a height of the housing is about 0.6 mm, the first phosphor, the second phosphor, and the third phosphor may have a size of about 40 µm to about 60 µm.

When a height of the housing is about 0.4 mm, the first phosphor, the second phosphor, and the third phosphor may have a sieve size of about 15 µm to about 40 µm.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
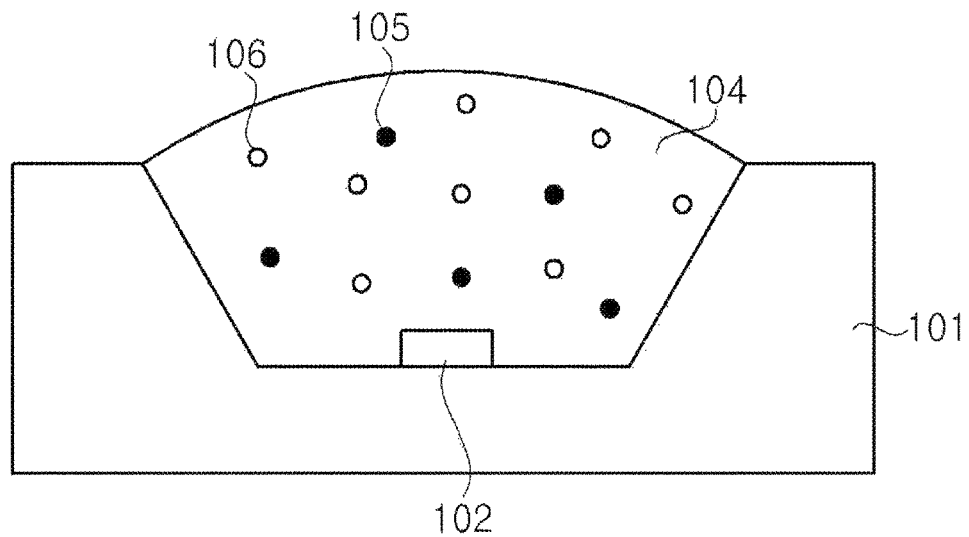
FIG. 1 is a cross-sectional view of an LED package according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring of various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

An LED package may implement white light by using phosphor as a wavelength conversion means as a yellow light-emitting phosphor, a green light-emitting phosphor, or a red light-emitting phosphor. In particular, the phosphor may be coated on an InGaN LED chip to convert some of the primary blue light of the LED chip to secondary yellow-based light (e.g., yellow light or yellow-green light). The secondary yellow-based light may mix with the primary blue light to produce white light. The white light-emitting diode package using a phosphor may be inexpensive and simple to manufacture.

However, a white LED package using yellow phosphor may have low color rendering due to spectrum deficiency of green and red zones of the emitted light. In particular, when the white LED package is used as a backlight unit, it may be difficult to implement a natural color due to low color purity after light is transmitted through a color filter.

To solve the above problem, the LED is manufactured by using the blue LED chip and phosphors emitting green light and red light by using the blue light as the excitation light. With the green and red light emitting phosphors, it is possible to create white light having high color rendering by mixing the blue, green, and red light. When the white LED is used as a backlight unit, conformity of the white LED with the color filter may be very high. Thus, the white LED may implement an image closer to a natural color.

However, the light emitted by the excitation of the green and red light emitting phosphors has a full width at half maximum (FWHM) wider than that of the LED chip. In particular, nitride phosphor has a wide FWHM in a red wavelength zone. The light having the wide FWHM has reduced color reproduction. Thus, it may be difficult to implement the desired color coordinates in the display with a wide FWHM.

Therefore, to implement the white light having higher color reproduction, a phosphor having a narrower FWHM may be used. To this end, a fluoride-based phosphor is used as the phosphor emitting the red light having the narrow FWHM. However, the fluoride-based phosphor may be vulnerable to moisture and have reduced heat stability. A reliable LED package may be needed to apply the LED package including the phosphor to various products. The reliability of the LED package ultimately influences the reliability of products to which the light emitting diode package is applied. Therefore, a light-emitting diode package including the phosphor having the high reliability while having the narrow FWHM may be developed.

Exemplary embodiments are discussed below that describe and illustrate a white light LED package having higher color reproduction with a narrower FWHM than the related art. Some exemplary embodiments may use a fluoride-based phosphor not vulnerable to moisture and having reduced heat stability. Thus, the exemplary embodiments describe the light-emitting diode packages that have high reliability with a narrow FWHM.

FIG. 1 is a cross-sectional view of an LED package according to an exemplary embodiment. Referring to FIG. 1, the LED package may include a housing 101, an LED chip 102, a first phosphor 105, a second phosphor 106, and a molding part 104.

The housing 101 may include a top surface opposite a bottom surface. The top surface of the housing 101 may include a lower portion, an upper portion, and an intermediate portion between the lower portion and the upper portion. The LED chip 102, the first phosphor 105, the second phosphor 106, and the molding part 104 may be disposed on the lower portion and the intermediate portion of the top surface of the housing 101. The LED chip 102 may be disposed on the lower portion of the top surface of the housing 101. The housing 101 may be provided with lead terminals (not illustrated) for inputting power to the LED chip 102. The molding part 104 may include the first phosphor 105 and the second phosphor 106. The molding part 104 may cover the LED chip 102.

The housing 101 may include at least one of a general plastic (polymer), an acrylonitrile butadiene styrene (ABS), a liquid crystalline polymer (LCP), a polyamide (PA), a polyphenylene sulfide (PPS), and a thermoplastic elastomer. The housing 101 may include at least one of a metal and a ceramic. The housing 101 may also include any other suitable material. When the LED chip 102 is an ultraviolet LED chip, the housing 101 may include ceramic. When the housing 101 is made of ceramic, the housing 101 including ceramic is not likely to be discolored or spoiled due to ultraviolet rays that are emitted from the ultraviolet LED chip. Thus, the reliability of the light emitting diode package may be maintained. When the housing 101 is made of metal, the housing 101 may include at least two metal frames that may be insulated from each other. Thus, heat radiation performance of the LED package may be improved by including metal in the housing 101. Although some materials that may form the housing 101 are described above, these materials are not exhaustive. The housing 101 may include any suitable material.

The housing 101 may include an inclined inner wall to reflect light emitted from the light emitting diode chip 102.

For example, the intermediate portion of the top surface of the housing 101 may include a first inclined inner wall and a second inclined inner wall.

The molding part 104 may include a material selected for a desired hardness. For example, the hardness of the molding part 104 may have a measurement numerical value of about 65 to about 75 when being measured by shore hardness and an indenter type may be a D type. To obtain the desired hardness, the molding part 104 may be made of materials including at least one of silicone, epoxy, polymethyl methacrylate (PMMA), polyethylene (PE), and polystyrene (PS). However, the molding part is not limited to these materials and may include any suitable material.

The molding part 104 may be formed by an injection molding process using the foregoing materials and a mixture of the first phosphor 105 and the second phosphor 106. Further, the molding part 104 may be manufactured using a separate mold followed by pressure or heat treatment. The molding part 104 may be formed to have various shapes such as a convex lens shape and a flat plate shape (not illustrated). The molding part 104 may also be formed to have a rough surface. Although FIG. 1 illustrates the light emitting diode package including a molding part 104 having the convex lens shape, it is envisioned that the molding part 104 may have any suitable shape.

The LED chip 102 may be an ultraviolet light LED chip or a blue LED chip. When the LED chip 102 is a LED chip, a peak wavelength of emitted light may range from about 410 nm to about 490 nm. A FWHM of a peak wavelength of blue light emitted from the LED chip 102 may be less than or equal to about 40 nm. The LED package may have a shape in which a single LED chip 102 is disposed. However, it is envisioned that the LED package may have any suitable shape and any number of LED chips 102.

The first phosphor 105 may be excited by the light emitted from the LED chip 102 to emit green light. The second phosphor 106 may be excited by the light emitted from the LED chip 102 to emit red light.

A peak wavelength of green light emitted from the first phosphor 105 may range from about 520 nm to about 570 nm. The first phosphor 105 may emit the green light having an FWHM less than or equal to about 35 nm. The first phosphor 105 may include at least one of a Ba—Al—Mg (BAM)-based phosphor, a quantum dot phosphor, and a fluoride-based phosphor. The fluoride-based phosphor may be a phosphor having a chemical formula of $A_2MF_6:Mn^{4+}$, with A being one of Li, Na, K, Rb, Ce, and $NH_4$ and M (not Mn) being one of Si, Ti, Nb, and Ta. Further, the fluoride-based phosphor may be expressed by the phosphor having a Chemical Formula of $A_xM_yF_z:Mn^{4+}_q$. Here, x and z may be defined by the following: $0<x\leq2.5$ and $0<z\leq7.0$. More specifically, x and z may be defined by the following: $1.8\leq x\leq2.3$ and $5.8\leq z\leq6.9$. Further, q may be about 0.02 to about 0.035 times about the y.

Although the first phosphor 105 is described above to include at least one of a Ba—Al—Mg (BAM)-based phosphor, a quantum dot phosphor, and a fluoride-based phosphor, the first phosphor 105 is not limited to such phosphors. It is envisioned that the first phosphor 105 may include any suitable phosphor.

As described above, the FWHM of the green light of the first phosphor 105 may be narrow (e.g., less than or equal to about 35 nm). Due to this narrow FWHM, an LED package having high color purity may be implemented. In contrast, the FWHM of the green light of the first phosphor 105, light with a FWHM greater than or equal to about 35 nm may cause low color purity of the emitted light making it difficult to reproduce a color over 85% in a full color reproduction range defined as a standard of a national television system committee (NTSC) system. Therefore, in order to implement NTSC color saturation of 85% or more of white light emitted from the LED, the first phosphor 105 emits green light having a FWHM of about 35 nm or less.

The second phosphor 106 may be excited by light from the LED chip 102 to emit red light. A peak wavelength of the red light emitted from the second phosphor 106 may range from about 610 nm to about 650 nm. The second phosphor 106 may include at least one of a quantum dot phosphor, a sulfide-based phosphor, and a fluoride-based phosphor. The fluoride-based phosphor may be a phosphor having a chemical formula of $A_2MF_6:Mn^{4+}$. In the above chemical formula, A may be one of Li, Na, K, Rb, Ce, and $NH_4$ and M (not Mn) may be one of Si, Nb, Ti, and Ta. Further, the fluoride-based phosphor may be expressed by the phosphor having a Chemical Formula of $A_xM_yF_z:Mn^{4+}_q$. Here, x and y may be defined by the following: $0<x\leq2.5$ and $0<z\leq7.0$. More specifically, x and 7 may be defined by the following: $1.8\leq x\leq2.3$ and $5.8\leq z\leq6.9$. Further, according to the exemplary embodiment of the present invention, q may be 0.02 to 0.035 times about the y.

The second phosphor 106 may emit red light having a narrow FWHM. More specifically, red light emitted from the quantum dot phosphor may have an FWHM of about 30 nm to about 40 nm. The red light emitted from the sulfide-based phosphor may have an FWHM of about 65 nm or less. The red light emitted from the fluoride-based phosphor may have an FWHM of 20 nm or less. In other words, the red light emitted from the second phosphor 106 as the fluoride-based phosphor may have the narrowest narrow FWHM compared to the sulfide-based phosphor and the quantum dot phosphor.

Hereinafter, the case in which at least one of the first phosphor 105 and the second phosphor 106 is the fluoride-based phosphor will be described in more detail.

As described above, the fluoride-based phosphor may include manganese (Mn) as an active ion. As the number of moles of manganese increases, a light quantity emitted from the fluoride-based phosphor may also increases. However, as the number of moles of manganese increases, the more the manganese oxidizes to form manganese oxide ($MnO_2$). Thus, the reliability of the phosphor and the LED package may be reduced.

To this end, the manganese ($Mn^{4+}$) in the chemical formula of $A_2MF_6:Mn^{4+}$ may have a number of moles within a range (i.e., a molar range) of about 0.02 to about 0.035 times M. When $Mn^{4+}$ has a number of moles less than about 0.02 times M, the LED package may have difficulty emitting a sufficient amount of light. When $Mn^{4+}$ has a number of moles exceeding about 0.035 times M, the $Mn^{4+}$ may increase oxidation to form more manganese oxide than desired. Thus, the increased amount of the manganese oxide may reduce the reliability of the fluoride-based phosphor and the LED package.

Further, when $Mn^{4+}$ of the fluoride-based phosphor has a number of moles within the foregoing range, the LED package may minimize a change in the light quantity. More specifically, when the LED package has the number of moles of $Mn^{4+}$ within the range of the number of moles, the change in light quantity of the emitted white light may be about 5% or less.

Further, x and y color coordinates forming one point on a International Commission on Illumination (CIE) chromaticity diagram of the white light may also be minimally changed. More specifically, the x color coordinates may be about 0.25 to about 0.32 and the y color coordinates may be about 0.22 to about 0.32. More specifically, the x color coordinates may be about 0.258 to about 0.265 and the y color coordinates may be about 0.225 to about 0.238.

Further, a change rate of light emitting intensity of the white light may also be minimal. More specifically, the change rate of the light emitting intensity of the white light may be about 5% or less.

Hereinafter, the LED package according to an exemplary embodiment including the fluoride-based phosphor will be described with reference to experiment examples.

Experimental Example 1

A first fluoride-based phosphor, a second fluoride-based phosphor, and a third fluoride-based phosphor were prepared. Here, the first fluoride-based phosphor was expressed by a chemical formula of $K_{2.230}Si_{0.968}F_{6.870}:Mn^{4+}_{0.032}$. The number of moles of $Mn^{4+}$ of the first fluoride-based phosphor is approximately 0.033 times the Si.

The chemical formula for the first fluoride-based phosphor is the same as the chemical formula for the second fluoride-based phosphor and the third fluoride-based phosphor, except for the number of moles of $Mn^{4+}$ and Si. The sum of the number of moles of $Mn^{4+}$ and Si is maintained at 1 for the second fluoride-based phosphor and the third fluoride-based phosphor. The number of moles of $Mn^{4+}$ of the second fluoride-based phosphor is approximately 0.025 times the Si. The number of moles of $Mn^{4+}$ of the third fluoride-based phosphor is approximately 0.020 times the Si.

A change in luminous flux, a change in luminous intensity, and a change in color coordinates of the white light of the LED package including the fluoride-based phosphors were measured. In Experimental Example 1, the fluoride-base phosphors were used as the red phosphor and one of the BAM-based phosphor (using $BaMgAl_{10}O_{17}:Eu$) and the quantum dot phosphor (using CdSe) was used as the green phosphor. Further, the excitation light emitted from the LED chip had a wavelength range of about 450 nm to about 460 nm.

As a result of measuring the luminous flux, the white light of the LED package (hereinafter, "first package") including the first fluoride-based phosphor was measured as showing a luminous flux of 74.5 lm. The white light of the LED package (hereinafter, "second package") including the second fluoride-based phosphor was measured as showing a luminous flux of 73.2 lm. The white light of the LED package (hereinafter, "third package") including the third fluoride-based phosphor was measured as showing a luminous flux of 72.7 lm. In other words, it may be appreciated that the luminous flux is changed by approximately 1.7-2.4% depending on the change in $Mn^{4+}$.

As a result of measuring the luminous intensity, the white light of the first package was measured as showing the luminous intensity of 23223 mcd. The white light of the second package was measured as showing the luminous intensity of 22640 mcd. The white light of the third package was measured as showing the luminous intensity of 22491 mcd. That is, it may be appreciated that the luminous intensity is changed by approximately 2.5-3.2% depending on the change in $Mn^{4+}$.

As a result of measuring the change in color coordinates (e.g., CIE), the x coordinate of the white light of the first package was measured as 0.264 and the y coordinate of the white light of the first package was measured as 0.236. The x coordinate of the white light of the second package was measured as 0.264 and the y coordinate of the white light of the second package was measured as 0.235. The x coordinate of the white light of the third package was measured as 0.264 and the y coordinate of the white light of the third package was measured as 0.232. In other words, it may be appreciated that the color coordinates are minutely changed depending on the change in $Mn^{4+}$.

Further, as a comparison result that the intensity of the peak wavelength (PL intensity) of the red light included in the white light is set to be 1, the intensity of green light of the first package may be measured as 0.34, the intensity of green light of the second package may be measured as 0.27, and the intensity of green light of the third package may be measured as 0.22.

The reliability of each package for luminous intensity was tested for 1000 hours. The temperature of each package was 85° C. and the current of each package was 120 mA.

It was shown that as compared with the first intensity, the luminous intensity of the first package is reduced by 9.5%, the luminous intensity of the second package is reduced by 9.6%, and the luminous intensity of the third package is reduced by 8.8%, after 1000 hours. Further, it was shown that for the first CIE coordinates, the x coordinate of the first package is changed by −0.013 and the y coordinate of the first package is changed by −0.007, the x coordinate of the second package is changed by −0.014 and the y coordinate of the second package is changed by −0.006, and the x coordinate of the third package is changed by −0.014 and the y coordinate of the third package is changed by −0.007.

Thus, it was shown that the luminous intensities of all of the light emitting diode packages according to Experimental Example 1 are reduced about 10% or less and the color coordinates are minutely changed. By contrast, when the luminous intensity is reduced by 10% or more and the change in the color coordinates was large, the light emitting diode package may have difficulty producing light of the proper color and of suitably intensity. Therefore, the light emitting diode package according to Experimental Example 1 may produce reliable light having suitable intensity and color over a long period of time.

Further, the reliability test against the luminous intensity was additionally performed for 1000 hours in the state in which the temperature of each package is 60° C., relative humidity is 90%, and a current is 120 mA.

In this case, it was shown that as compared with the first intensity, the luminous intensity of the first package is reduced by 4.2%, the luminous intensity of the second package is reduced by 2.6%, and the luminous intensity of the third package is reduced by 3.3%. Further, it was shown that for the first CIE coordinates, the x coordinate of the first package is changed by −0.006 and the y coordinate of the first package is changed by −0.006, the x coordinate of the second package is changed by −0.007 and the y coordinate of the second package is changed by −0.004, and the x coordinate of the third package is changed by −0.008 and the y coordinate of the third package is changed by −0.005. Thus, when the light emitting diode package according Experimental Example 1 is exposed to the high humidity environment over a long period of time, the luminous intensity is reduced by 5% or less and the color coordinates are minutely changed, thereby resulting in an LED package having high reliability when compared to the related art.

Experimental Example 2

A fourth fluoride-based phosphor, a fifth fluoride-based phosphor, and a sixth fluoride-based phosphor were prepared. Here, the fourth fluoride-based phosphor was expressed by a chemical formula of $K_{2.130}Si_{0.970}F_{6.790}$:$Mn^{4+}_{0.030}$. The number of moles of $Mn^{4+}$ of the fourth fluoride-based phosphor is approximately 0.031 times about Si.

The chemical formula for the fourth fluoride-based phosphor is the same as the chemical formula for the fifth fluoride-based phosphor and the sixth fluoride-based phosphor, except for the number of moles of $Mn^{4+}$ and Si. The sum of the number of moles of $Mn^{4+}$ and Si for the fifth fluoride-based phosphor and the sixth fluoride-based phosphor is maintained at 1. The number of moles of $Mn^{4+}$ of the fifth fluoride-based phosphor is approximately 0.025 times about Si. The number of moles of $Mn^{4+}$ of the sixth fluoride-based phosphor is approximately 0.020 times about Si. Here, a sum of the number of moles of Si and the number of moles of Mn may be maintained at 1.

A change in luminous flux, a change in luminous intensity, and a change in color coordinates, of the white light of the light emitting diode package including the fluoride-based phosphors were measured. In Experimental Example 2, the fluoride-base phosphors were used as a red phosphor, one of the BAM-based phosphor (used $BaMgAl_{10}O_{17}$:Eu) and the quantum dot phosphor (using CdSe) was used as the green phosphor. Further, the excitation light emitted from the light emitting diode chip used a wavelength range of 450 nm to 460 nm.

As a result of measuring the luminous flux, the white light of the light emitting diode package (hereinafter, "fourth package") including the fourth fluoride-based phosphor was measured as showing a luminous flux of 74.4 lm, the white light of the light emitting diode package (hereinafter, "fifth package") including the fifth fluoride-based phosphor was measured as showing a luminous flux of 73.2 lm, and the white light of the light emitting diode package (hereinafter, "sixth package") including the sixth fluoride-based phosphor was measured as showing a luminous flux of 72.8 lm. In other words, it may be appreciated that the luminous flux is changed by approximately 1.6-2.2% depending on the change in $Mn^{4+}$.

As a result of measuring the luminous intensity, the white light of the fourth package was measured as showing the luminous intensity of 23540 mcd, the white light of the fifth package was measured as showing the luminous intensity of 22719 mcd, and the white light of the sixth package was measured as showing the luminous intensity of 23360 mcd. In other words, it may be appreciated that the luminous intensity is changed by approximately 0.8-3.5% depending on the change in $Mn^{4+}$.

As a result of measuring the change in color coordinates (e.g., CIE), the x coordinate of the white light of the fourth package was measured as 0.264 and the y coordinate of the white light of the fourth package was measured as 0.237, the x coordinate of the white light of the fifth package was measured as 0.264 and the y coordinate of the white light of the fourth package was measured as 0.235, and the x coordinate of the white light of the sixth package was measured as 0.264 and the y coordinate of the white light of the fourth package was measured as 0.234. In other words, it may be appreciated that the color coordinates are almost constant independent of the change in $Mn^{4+}$.

Further, as a comparison result that the intensity of the peak wavelength (PL intensity) of the red light included in the white light is set to be 1, the intensity of green light of the fourth package might be measured as 0.32, the intensity of green light of the fifth package might be measured as 0.27, and the intensity of green light of the sixth package might be measured as 0.22.

The reliability of each package was tested for 1000 hours of the luminous intensity with a temperature of each package at 85° C. and a current of 120 mA.

It was shown that as compared with the first intensity, the luminous intensity of the fourth package is reduced by 8.5%, the luminous intensity of the fifth package is reduced by 9.4%, and the luminous intensity of the sixth package is reduced by 9.7%, after 1000 hours. Further, it was shown that for the first CIE coordinates, the x coordinate of the fourth package is changed by −0.013 and the y coordinate of the fourth package is changed by −0.007, the x coordinate of the fifth package is changed by −0.013 and the y coordinate of the fifth package is changed by −0.007, and the x coordinate of the sixth package is changed by −0.012 and the y coordinate of the sixth package is changed by −0.007.

Thus, it was shown that the luminous intensities of all of the light emitting diode packages according to Experimental Example 2 are reduced by 10% or less and the color coordinates are minutely changed. By contrast, when the luminous intensity is reduced by 10% or more and the change in the color coordinates was large, the light emitting diode package may have difficulty producing light of the proper color and of suitably intensity. Therefore, the light emitting diode package according to Experimental Example 2 may produce reliable light having suitable intensity and color over a long period of time.

Further, the reliability test against the luminous intensity was additionally performed for 1000 hours in the state in which the temperature of each package is 60° C., relative humidity is 90%, and a current is 120 mA.

In this case, it was shown that as compared with the first intensity, the luminous intensity of the fourth package is reduced by 2.1%, the luminous intensity of the fifth package is reduced by 1.9%, and the luminous intensity of the sixth package is reduced by 2.2%. Further, it was shown that for the first CIE coordinates, the x coordinate of the fourth package is changed by −0.007 and the y coordinate of the fourth package is changed by −0.004, the x coordinate of the fifth package is changed by −0.007 and the y coordinate of the fourth package is changed by −0.004, and the x coordinate of the sixth package is changed by −0.006 and the y coordinate of the fourth package is changed by −0.005. Thus, when the light emitting diode package according to Experimental Example 2 is exposed to the high humidity environment over a long period of time, the luminous intensity is reduced by 3% or less and the color coordinates are minutely changed, thereby securing the relatively higher reliability as compared with the related art.

According to an exemplary embodiment, the fluoride-based phosphor having the chemical formula $A_2MF_6$:$Mn^{4+}$, with A being one of Li, Na, K, Rb, Ce, and $NH_4$, M being one of Si, Ti, Nb, and Ta, and $Mn^{4+}$ of having a molar range of about 0.02 to about 0.035 times M results in a reliable LED package with sufficient light quantity.

Figure 2:
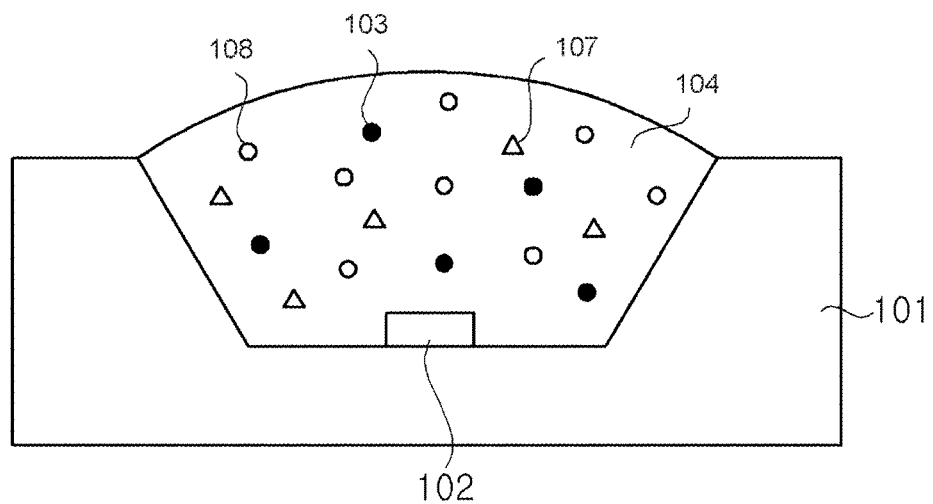
FIG. 2 is a cross-sectional view of an LED package according to an exemplary embodiment.

FIG. 2 is a cross-sectional view of an LED package according to an exemplary embodiment. FIG. 2 is substantially similar to FIG. 1 except that FIG. 2 may include a first phosphor 103, a second phosphor 108, and a third phosphor 107. To avoid repetition, the same elements will be omitted.

The LED chip 102, the first phosphor 103, the second phosphor 108, the third phosphor 107, and the molding part 104 may be disposed on the lower portion and the intermediate portion of the top surface of the housing 101 (as described with reference to FIG. 1). The molding part 104 may include the first phosphor 103, the second phosphor 108, and the third phosphor 107. The molding part 104 may cover the LED chip 102. The molding part 104 be manufactured in the same manner as described with reference to FIG. 1 except including a mixture of the first phosphor 103, the second phosphor 108, and the third phosphor 107 instead of a mixture of the first phosphor 105 and the second phosphor 106. The molding part 104 may also have the same structure and shape as described with reference to FIG. 1.

The first phosphor 103 may be excited by the light emitting diode chip 102 to emit green light. The second phosphor 108 and the third phosphor 107 may be excited by the light emitting diode chip 102 to emit red light.

A peak wavelength of green light which is emitted from the first phosphor 103 may range from about 500 to about 570 nm. The first phosphor 103 may emit the green light having an FWHM less than or equal to about 35 nm. The first phosphor 103 may include at least one of a Ba—Al—Mg (BAM)-based phosphor, a quantum dot phosphor, a silicate-based phosphor, a beta-SiAlON-based phosphor, a Garnet-based phosphor, an LSN-based phosphor, and a fluoride-based phosphor. The fluoride-based phosphor may be a phosphor having a chemical formula of $A_2MF_6:Mn^{4+}$. In the above Chemical Formula, the A may be one of Li, Na, K, Ba, Rb, Cs, Mg, Ca, Se, and Zn and the M may be Ti, Si, Zr, Sn, and Ge. Although the first phosphor 103 is described above to include at least one of a Ba—Al—Mg (BAM)-based phosphor, a quantum dot phosphor, a silicate-based phosphor, a beta-SiAlON-based phosphor, a Garnet-based phosphor, an LSN-based phosphor, and a fluoride-based phosphor, the first phosphor 103 is not limited to such phosphors. It is envisioned that the first phosphor 103 may include any suitable phosphor.

The second phosphor 108 may be excited by the light emitting diode chip 102 to emit red light. A peak wavelength of the red light which is emitted from the second phosphor 108 may range from about 610 to about 650 nm. The second phosphor 108 may include at least one of a quantum dot phosphor, a sulfide-based phosphor, and a fluoride-based phosphor. The fluoride-based phosphor may be a phosphor having a chemical formula of $A_2MF_6:Mn^{4+}$. In the above Chemical Formula, the A may be one of Li, Na, K, Ba, Rb, Cs, Mg, Ca, Se, and Zn and the M may be one of Ti, Si, Zr, Sn, and Ge.

The second phosphor 108 may emit red light having a narrow FWHM. More specifically, red light emitted from the quantum dot phosphor may have an FWHM of about 30 nm to about 40 nm. The red light emitted from the sulfide-based phosphor may have an FWHM of about 65 nm or less. The red light emitted from the fluoride-based phosphor may have an FWHM of 20 nm or less. In other words, the red light emitted from the second phosphor 108 as the fluoride-based phosphor may have the narrowest FWHM compared to the sulfide-based phosphor and the quantum dot phosphor.

The third phosphor 107 may be excited by light from the light emitting diode chip 102 to emit red light. The peak wavelength of the red light emitted from the third phosphor 107 may be different from that of red light emitted from the second phosphor 108. More specifically, the peak wavelength of the red light emitted from the third phosphor 107 may range from about 600 nm to about 670 nm. The third phosphor 107 may be a nitride-based phosphor. The nitride-based phosphor may include a chemical formula expressed by $MSiN_2$, $MSiON_2$, and $M_2Si_5N_8$, with M being one of Ca, Sr, Ba, Zn, Mg, and Eu. The third phosphor 107 may have a mass range of 0.1 to 10 wt % with respect to the second phosphor 108. In more detail, the third phosphor 107 may have a mass range of 1.48 to 10 wt % with respect to the second phosphor 106.

According an exemplary embodiment, when a mass percentage of the third phosphor 107 to the second phosphor 108 is larger than or equal to about 0.1 wt %, the reliability of the phosphors may be enhanced. Further, when a mass percentage of the third phosphor 107 to the second phosphor 108 is larger than or equal to about 1.48 wt %, the reliability of the phosphors may further be enhanced. Further, when the mass percentage of the third phosphor 107 to the second phosphor 108 exceeds 10 wt %, the FWHM of the red light emitted from the second phosphor 108 and the third phosphor 107 may be increased to a threshold value or more, thereby reducing the color reproduction of the LED package including the first phosphor 103, the second phosphor 108, and the third phosphor 107. Thus, an exemplary embodiment includes a second phosphor 108 having an FWHM in a range from about 1 nm to about 10 nm and a third phosphor 107 having an FWHM in a range from about 70 nm to 100 nm.

According an exemplary embodiment, the LED package includes the second phosphor 108 and the third phosphor 107, both which emit red light. When the third phosphor 107 is the nitride-based phosphor, the third phosphor 107 is resistant to heat and/or moisture, thereby further enhance the reliability of the phosphors and the LED package. Therefore, the LED package according to an exemplary embodiment may maintain the CIE color coordinates within a predetermined range even after a prolonged period of use.

Hereinafter, the LED package according to an exemplary embodiment including the second phosphor 108 and the third phosphor 107 will be described with reference to experimental examples.

Experimental Example 3

Two sample LED packages are prepared. A first sample is a red phosphor that includes the second phosphor 108 without any other phosphor and a second sample is a red phosphor that includes the second phosphor 108 and the third phosphor 107. Except for the red phosphors (e.g., the second phosphor 108 without the third phosphor 107 or the second phosphor 108 with the third phosphor 107), all other conditions of the first and second samples are the same.

Here, the second phosphor 108 is a fluoride-based phosphor having a Chemical Formula of $K_2SiF_6:Mn^{4+}$. The third phosphor 107 is a nitride-based phosphor having a chemical formula of $CaSiN_2Eu^{2+}$. The third phosphor 107 has a mass of 2.96 wt % with respect to the second phosphor 108. Each of the first and second samples includes the green phosphor. As the green phosphor, the beta-SiAlON-based phosphor is used and may be expressed by a chemical formula of $\beta\text{-SiAlON:Eu2}^+$. Further, to excite the phosphors included in each of the samples, the excited light emitted from the LED chip 102 has a wavelength range of 440 nm to 460 nm.

A reliability test was performed on each sample having the foregoing conditions for 1000 hours. A temperature of the samples was 85° C. and an input current was 20 mA.

For a first CIE coordinate after the reliability test is completed, it was shown that an x color coordinate of the first sample is changed by −0.011 and a y color coordinate is changed by +0.002. On the other hand, it was shown that an x color coordinate of the second sample is changed by −0.007 and a y color coordinate is changed by +0.002.

Thus, it may be appreciated that an LED package according an exemplary embodiment that includes two types of red phosphors (e.g., second phosphor 108 and third phosphor 107) exhibits higher reliability under high temperature environment than an LED package that includes one fluoride-based phosphor without an additional red phosphor of a different type.

Experimental Example 4

The reliability test was performed for 1000 hours by changing temperature and humidity conditions, while having the same samples as the foregoing first and second samples of Experimental Example 3. A temperature of the samples was 60° C., relative humidity was 90%, and the input current was 20 mA.

For the first sample, CIE coordinates after the reliability test is completed, it was shown that the x color coordinate of the first sample is changed by −0.007 and the y color coordinate is changed by +0.006. On the other hand, it was shown that the x color coordinate of the second sample is changed by −0.003 and the y color coordinate is changed by +0.006.

Thus, it may be appreciated that an LED package according to an exemplary embodiment includes two types of red phosphors exhibits better reliability under high humidity environment than a light emitting diode package that includes one fluoride-based phosphor without an additional red phosphor of a different type.

Figure 3:
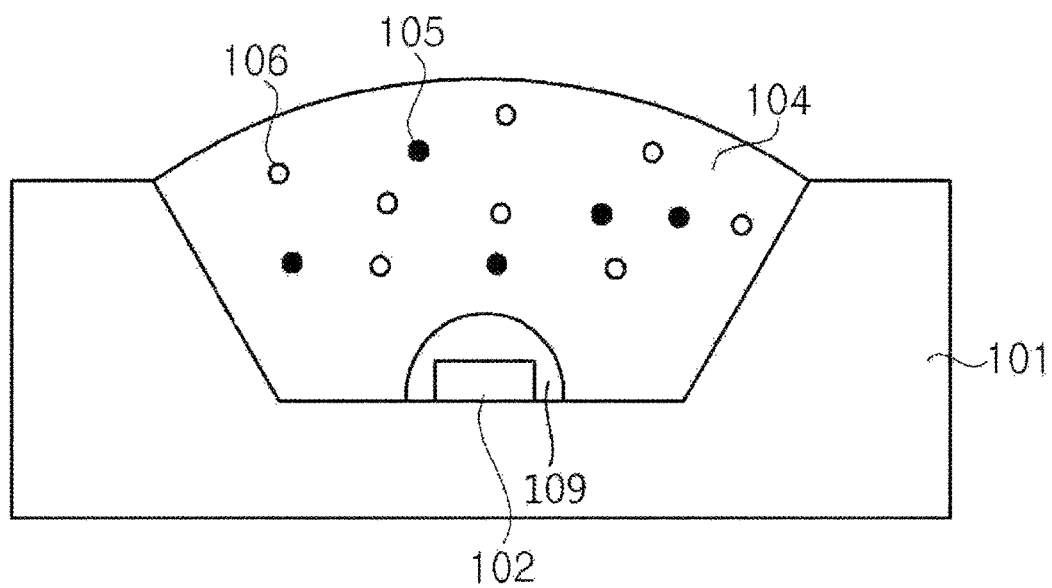
FIG. 3 is a cross-sectional view of an LED package according to an exemplary embodiment.

FIG. 3 is a cross-sectional view of an LED package according to an exemplary embodiment. Referring to FIG. 3, the LED package includes a buffer part 109 in addition to the features illustrated and described with reference to FIG. 1. The features of FIG. 1 are omitted for brevity and to avoid obscuring the exemplary embodiments.

The buffer part 109 may be disposed between the LED chip 102 and the molding part 104. The buffer part may be made of materials including at least one of silicone, epoxy, polymethyl methacrylate (PMMA), polyethylene (PE), and polystyrene (PS). The hardness of the buffer part 109 may be less than that of the molding part 104. For example, the hardness of the buffer part 109 may have a measurement numerical value of 59 to 61 when being measured by the shore hardness and the indenter type may be an A type. Thermal stress of the molding part 104 due to heat generated from the LED chip 102 may be prevented by using the buffer part 109. Although the buffer part 109 is illustrated are being closely disposed around the LED chip 102, but the buffer part 109 may also be disposed in a wide region to contact both the first inclined wall and the second inclined wall of the housing 101.

Figure 4:
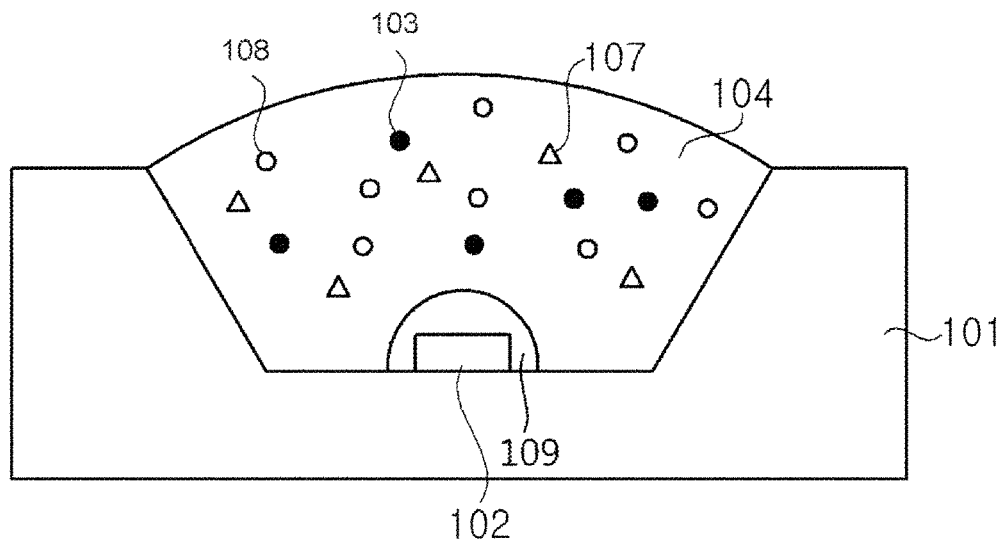
FIG. 4 is a cross-sectional view of an LED package according to an exemplary embodiment.

FIG. 4 is a cross-sectional view of an LED package according to an exemplary embodiment. Referring to FIG. 4, the LED package includes a buffer part 109 in addition to the features illustrated and described with reference to FIG. 2. The features of FIG. 2 are omitted for brevity and to avoid obscuring the exemplary embodiments. The buffer part 109 may be the same as illustrated and described with reference to FIG. 3 and thus is also omitted to avoid obscuring the exemplary embodiments.

Figure 5:
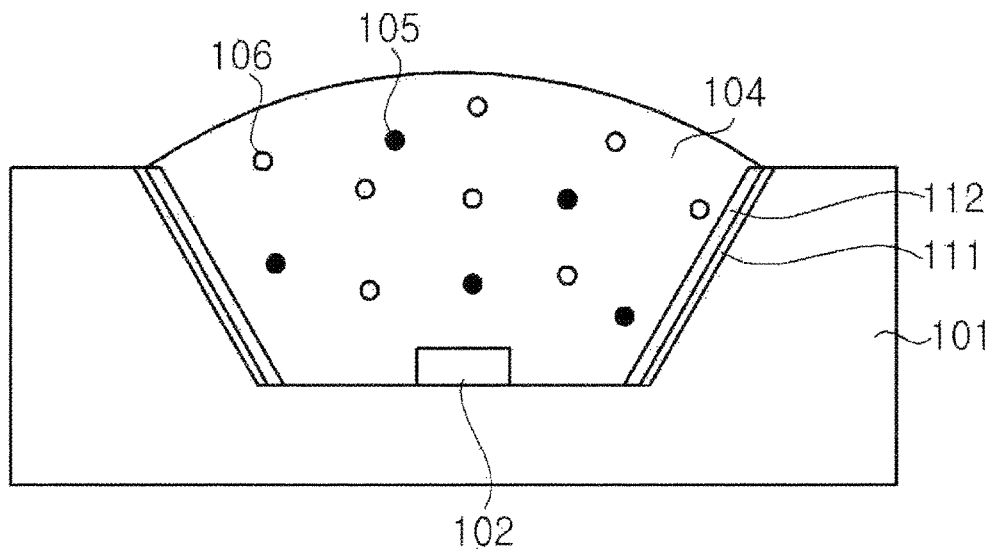
FIG. 5 is a cross-sectional view of an LED package according to an exemplary embodiment.

FIG. 5 is a cross-sectional view illustrating an LED package according to an exemplary embodiment. Referring to FIG. 5, the LED package includes a reflector 111 and a barrier reflector 112 in addition to the features illustrated and describe with reference to FIG. 1. The features of FIG. 1 are omitted for brevity and to avoid obscuring the exemplary embodiments.

The reflector 111 may be disposed on a side of the housing 101, while being spaced apart from the LED chip 102. For example, the reflector 111 may be disposed on the first inclined wall and the second inclined wall of the housing 101. The reflector 111 may be configured to maximize the reflection of light emitted from the LED chip 102 and the first phosphor 105 and the second phosphor 106 to increase luminous efficiency. The reflector 111 may be formed of any one of a reflection coating film and a reflection coating material layer. The reflector 111 may include at least one of inorganic materials and organic materials. The reflector may include have excellent heat resistance and light resistance such as metals and metal oxides. For example, the reflector 111 may include at least one of aluminum (Al), silver (Ag), gold (Au), and titanium dioxide ($TiO_2$). The reflector 111 may be formed by depositing or coating the metals or the metal oxides on the housing 101. The reflector 111 may also be formed by printing metal ink. Further, the reflector 111 may also be formed by bonding a reflection film or a reflection sheet on the housing 101. The reflector 111 is not limited to the materials listed and may include any suitable material. In addition, the reflector may be formed by any suitable means.

The barrier reflector 112 may cover the reflector 111. The barrier reflector 112 may prevent the deterioration of the reflector 111 due to the heat emitted from the LED chip 102. The barrier reflector 112 may include at least one of organic materials and inorganic materials. The barrier reflector 112 may include metal materials having the high light resistance and reflectance.

Figure 6:
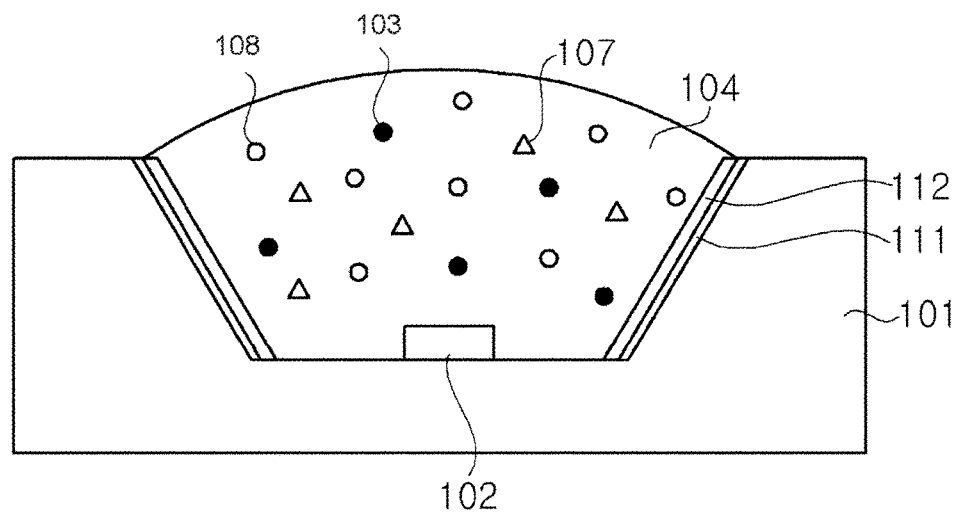
FIG. 6 is a cross-sectional view of an LED package according to an exemplary embodiment.

FIG. 6 is a cross-sectional view of an LED package according to an exemplary embodiment. Referring to FIG. 6, the LED package includes the reflector 111 and barrier reflector 112 described with reference to FIG. 5 in addition to the features illustrated and described with reference to FIG. 2. The similar features of FIG. 2 and FIG. 5 are omitted for brevity and to avoid obscuring the exemplary embodiments.

Figure 7:
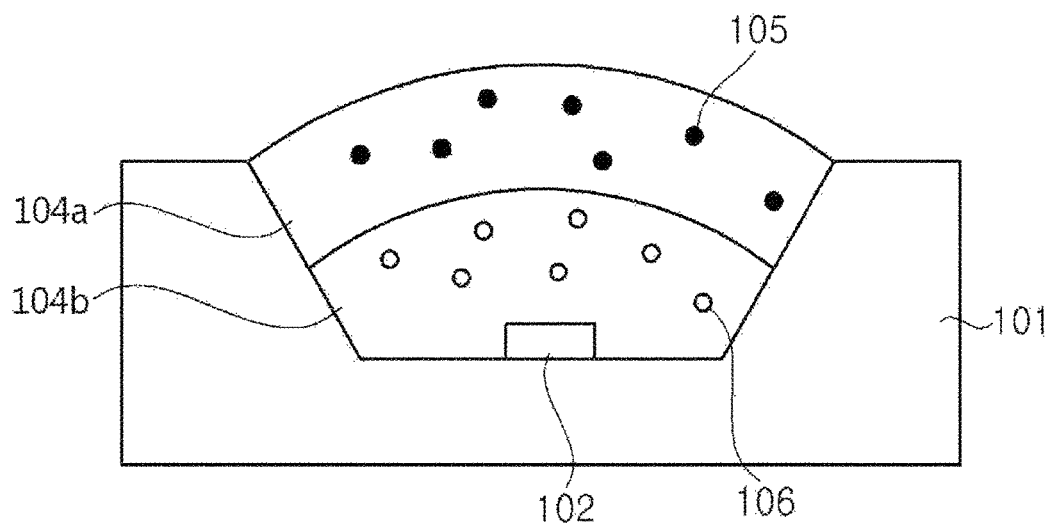
FIG. 7 is a cross-sectional view of an LED package according to an exemplary embodiment.

FIG. 7 is a cross-sectional view of an LED package according to an exemplary embodiment. Referring to FIG. 7, the LED package includes a molding part 104 that includes a first molding part 104b and a second molding part 104a in addition to the features described and illustrated with respect to FIG. 1. The similar features of FIG. 1 are omitted for brevity and to avoid obscuring the exemplary embodiments.

The first molding part 104b may cover the LED chip 102. The second molding part 104a may cover the first molding part 104b. The first molding part 104b may include the same or different material as the second molding part 104a. The first molding part 104b may have the same or a different hardness as the second molding part 104a. The hardness of the first molding part 104b may be lower than the hardness of the second molding part 104a. Similar to the buffer part 109, when the hardness of the first molding part 104b is lower than the second molding part 104a, thermal stress due to the heat from the LED chip 102 may be alleviated.

The first molding part 104b may include the second phosphor 106 which emits the red light. The second molding part 104a may include the first phosphor 105 which emits the green light. Thus, the phosphors that emit long wavelength light are disposed closer to the LED chip 102 that (i.e., at a lower portion in the LED package) than the phosphors that emit short wavelength light. Accordingly, the arrangement of the phosphors prevents the second phosphors 106 from absorbing the green light emitted from the first phosphor 105.

Figure 8:
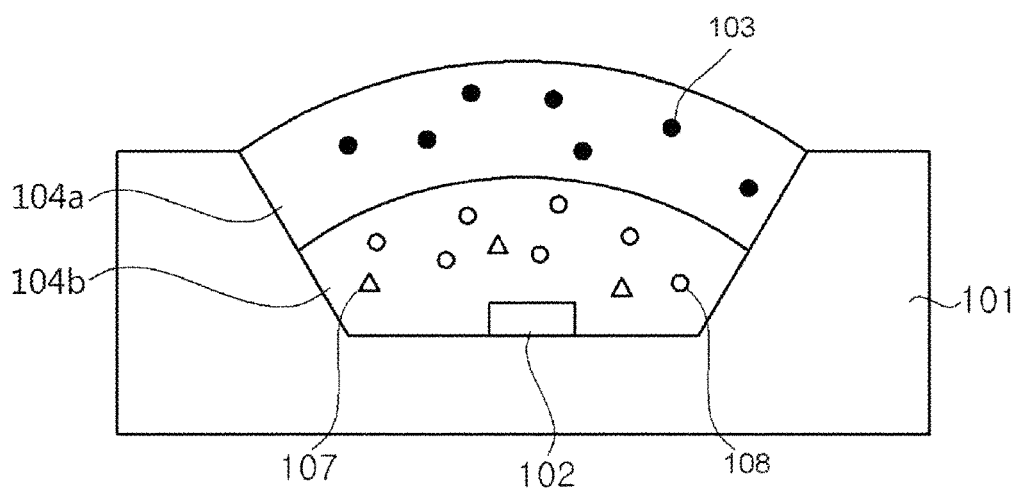
FIG. 8 is a cross-sectional view of an LED package according to an exemplary embodiment.

FIG. 8 is a cross-sectional view of a light emitting diode package according to an eighth exemplary embodiment of the present invention. Referring to FIG. 8, the LED package includes a molding part 104 that includes a first molding part 104b and a second molding part 104a in addition to the features described and illustrated with respect to FIG. 1. The similar features of FIG. 2 are omitted for brevity and to avoid obscuring the exemplary embodiments. The first molding part 104b of FIG. 8 is the same as the first molding part 104b described and illustrated with reference to FIG. 7, except the first molding part 104b of FIG. 8 includes the second phosphor 108 and the third phosphor 107 described with reference to FIG. 2. The second molding part 104a is the same as the second molding part 104a described and illustrated with reference to FIG. 7, except the second molding part 104a of FIG. 8 includes the first phosphor 103 described with reference to FIG. 2

Similar to FIG. 7, the phosphors of FIG. 8 that emit a long wavelength are disposed closer to the LED chip 102 that (i.e., at a lower portion in the LED package) than the phosphors that emit short wavelength light. In other words, the second phosphors 108 and the third phosphors 107 are disposed closer to the LED chip 102 than the first phosphors 103. Accordingly, the arrangement of the phosphors prevents the second phosphors 108 and the third phosphors 107 from absorbing the green light emitted from the first phosphors 103.

Figure 9:
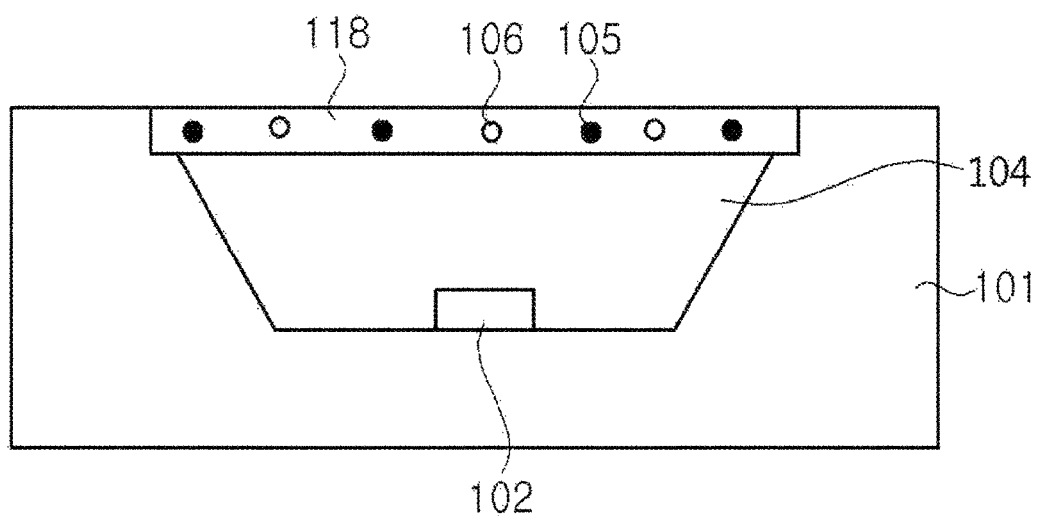
FIG. 9 is a cross-sectional view of an LED package according to an exemplary embodiment.

FIG. 9 is a cross-sectional view of an LED package according to an exemplary embodiment. Referring to FIG. 9, the LED package may include all the features described with references to FIG. 1, except FIG. 9 also includes a phosphor plate 118 with a first phosphor 105 and a second phosphor 106 and a molding part 104 without the first phosphor 105 and the second phosphor 106. The similar features of FIG. 1 are omitted for brevity and to avoid obscuring the exemplary embodiments.

Referring to FIG. 9, the phosphor plate 118 may be disposed on the molding part 104 while being spaced apart from the LED chip 102. The phosphor plate 118 may include the first phosphor 105 and the second phosphor 106. The phosphor plate 118 may include the same material as the molding part 104. Alternately, the phosphor plate 118 may include a harder material than the molding part 104. In an alternate embodiment, an empty space may be formed between the phosphor plate 118 and the light emitting diode chip 102 instead of the molding part 104.

Because the first phosphor 105 and the second phosphor 106 are disposed while being spaced from the light emitting diode chip 102, it is possible to reduce damage to the first phosphor 105 and the second phosphor 106 and the phosphor plate 118 caused by heat or light from the first phosphor 105 and the second phosphor 106 first and second phosphors 105 and 106. In addition, damage to the first phosphor 105 and the second phosphor 106 from the heat generated from the LED chip 102 may be reduced by using the phosphor plate 118 that is space apart from the LED chip 102. Therefore, the reliability of the first phosphor 105 and the second phosphor 106 may be improved.

According to an exemplary embodiment, it is possible to provide the LED package including the phosphor emitting light having the narrow FWHM to improve the color reproduction of the LED package. Further, it is possible to prevent the deterioration phenomenon of the phosphor under the high temperature and/or high humidity environment to improve the reliability of the phosphor, thereby improving the overall reliability of the LED package.

Figure 10:
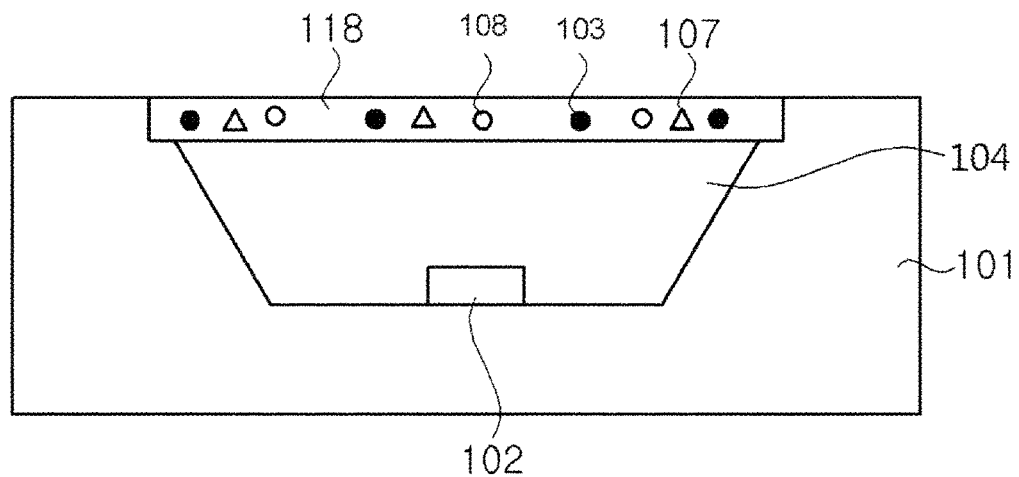
FIG. 10 is a cross-sectional view of an LED package according to an exemplary embodiment.

FIG. 10 is a cross-sectional view of a LED package according to an exemplary embodiment. Referring to FIG. 10, the LED package may include all the features described with references to FIG. 2, except FIG. 10 also includes a phosphor plate 118 with a first phosphor 103, a second phosphor 108, a third phosphor 107, and a molding part 104 without the first phosphor 103, the second phosphor 108, the third phosphor 107. The similar features of FIG. 2 are omitted for brevity and to avoid obscuring the exemplary embodiments.

Referring to FIG. 10, the phosphor plate 118 may be disposed on the molding part 104 while being spaced apart from the light emitting diode chip 102. The phosphor plate 118 may include the first phosphor 103, the second phosphor 108, and the third phosphor 107. The phosphor plate 118 may include the same material as the molding part 104. Alternately, the phosphor plate 118 may include a harder material than the molding part 104. In an alternate embodiment, an empty space may be formed between the phosphor plate 118 and the light emitting diode chip 102 instead of the molding part 104.

Because the first phosphor 103, second phosphor 19, and the third phosphor 107 are disposed while being spaced from the light emitting diode chip 102, it is possible to reduce damage to the first phosphor 103, second phosphor 19, and the third phosphor 107 caused by heat or light from the first phosphor 103, second phosphor 19, and the third phosphor 107. In addition, damage to the first phosphor 103, second phosphor 19, and the third phosphor 107 from the heat generated from the LED chip 102 may be reduced by using the phosphor plate 118 that is space apart from the LED chip 102. Therefore, the reliability of the first phosphor 103, second phosphor 19, and the third phosphor 107 may be improved.

Figure 11:
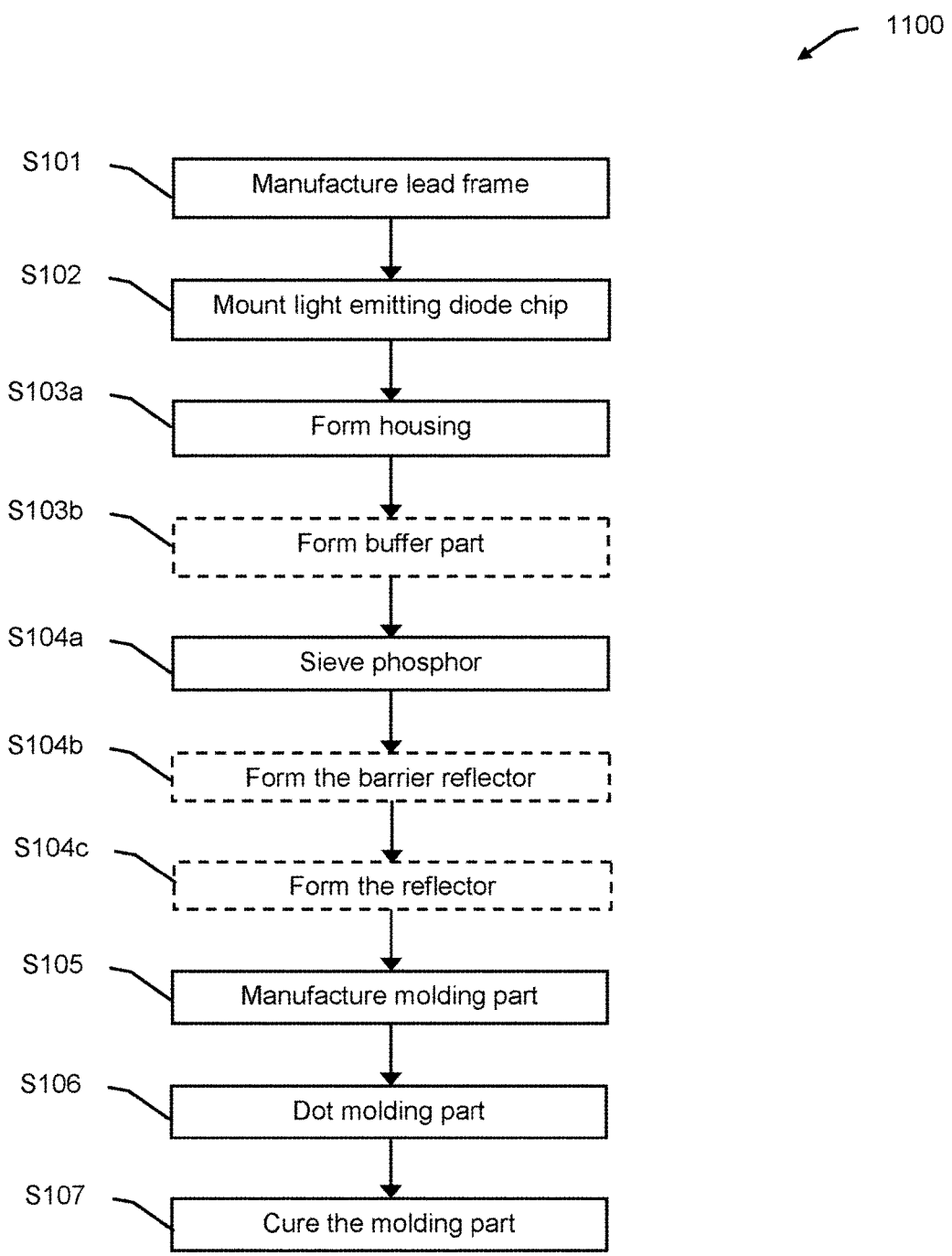
FIG. 11 is a flow chart of a manufacturing method of an LED package according to an exemplary embodiment.
Figure 12:
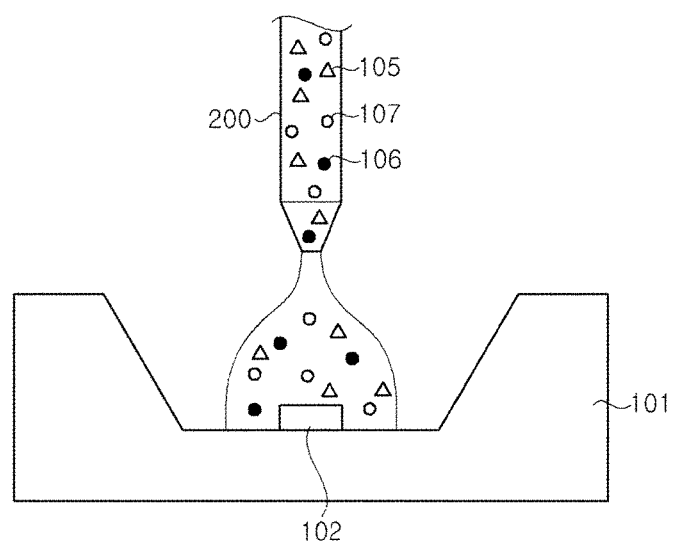
FIG. 12 is a diagram of a process of dotting a phosphor at the time of manufacturing the LED package according an exemplary embodiment.

FIG. 11 is a flow chart of a manufacturing method 1100 of an LED package according to an exemplary embodiment. FIG. 12 is a diagram illustrating a process of dotting phosphors 103, 108, and 107 at the time of manufacturing the LED package according to an exemplary embodiment. The manufacturing method 1100 of the LED package according to an exemplary embodiment will be described with reference to FIG. 12 along with the flow chart of FIG. 11.

According to an exemplary embodiment, the method 1100 includes manufacturing a lead frame (S101). The lead frame may form a conductive pattern on a surface of a substrate. Further, the manufacturing processes may alter the shape of the lead frame based on the type of the LED package.

The method 1100 may further include mounting the LED chip 102 to the lead frame (S102). Specifically, the LED chip 102 may be mounted on the conductive pattern formed on the lead frame. The lead frame is not shown in FIG. 12.

The method 1100 may further include forming the housing 101 (S103a). The housing 101 may be form (or packaged) such that the LED chip 102 is mounted on the lead frame. As illustrated in FIG. 12, the housing 101 may be formed to enclose a part or the entire lead frame to support the lead frame. The housing 101 may also be formed such that it includes a cavity with the LED chip disposed in that cavity.

The method 1100 may optionally include forming a buffer part 109 (S103b). The buffer part 109 may be formed in any suitable manner. For example, the buffer part 109 may be formed by disposing the buffer part 109 over the LED chip 102 and a portion of the housing 101 immediately surrounding the LED chip 102. The buffer part 109 may be applied to the LED chip 102 and the housing 101 with the needle 200 in a similar fashion as the molding part 104. For example, the buffer part may be applied over the LED chip 102 and a portion of the housing 101 immediately surrounding the LED chip 102 with the needle 200 or some other injection type device and the subsequently cure with at least one of heat, ultra violet light, and pressure. The buffer part 109 may be printed over the LED chip 102.

The molding part 104 needs to be manufactured before the molding part 104 is formed in the formed housing 101. Although FIG. 12 illustrates the first phosphor 103, the second phosphor 108, and the third phosphor 107 forming the molding part 104, it is envisioned that the molding part may include at least one of the first phosphor 105, the first phosphor 103, the second phosphor 106, the second phosphor 108, and the third phosphor 107 described in the above exemplary embodiment. For clarity and ease of reference in describing the manufacturing method, the molding part 104 will be described as having the first phosphor 103, the second phosphor 108, and the third phosphor 107. However, the manufacturing method is not intended to be limited to the first phosphor 103, the second phosphor 108, and the third phosphor 107 forming the molding part 104. The light emitted from the LED chip 102 is excited by at least one of the phosphors 107, 103, and 108 having a grain shape and a predetermined size as illustrated in FIG. 12. The phosphors 107, 103, and 108 having a granular particle shape are formed in the LED package in the state in which they are mixed in the liquid-phase molding part 104.

When the molding part 104 is formed on the upper portion of the light emitting diode chip 102, the molding part 104 may be formed by various processes, but it will be described that the molding part is formed by the dotting process in the manufacturing method of a LED package according to an exemplary embodiment.

The dotting process applies the liquid-phase molding part 104 using a needle 200 to the upper portion of the LED chip 102. To accommodate varieties in LED package sizes, an inlet of the needle 200 may also vary. The phosphors 107, 103, and 108 having the granular particle shape may be mixed with the liquid-phase molding part 104. The mixture may be dotted on the LED package using the needle 200. If the particles of the phosphors 107, 103, and 108 are larger than the inlet of the needle 200, the inlet of the needle 200 may become plugged. For this reason, the particle size of the phosphors 105, 106, and 107 needs to be limited depending on the size of the LED package. According to an exemplary embodiment, the phosphors 107, 103, and 108 may be sieved depending on the required size prior to manufacturing the liquid-phase molding part 104.

The method 1100 may further include sieving the phosphors 107, 103, and 108 (S104a). The sieving of the phosphors 107, 103, and 108 is a process of filtering the phosphors 107, 103, and 108 to allow the size of the phosphors 107, 103, and 108 to refrain from exceeding a predetermined size (i.e., a small enough size to prevent the needle 200 from plugging due to the phosphors). According to an exemplary embodiment, when the entire height of the housing 101 is 0.6 mm, the phosphors 103, 108, and 107 may have a mesh size of about 40 µm to about 60 µm. As a further example, the mesh size of the phosphors 103, 108, and 107 used with a housing of about 0.6 mm may be about 40 µm to about 50 µm. Further, when the entire height of the housing 101 is 0.4 mm, the phosphors 103, 108, and 107 may have a mesh size of about 15 µm to about 40 µm. As a further example, the mesh size of the phosphors 103, 108, and 107 used with a housing of about 0.4 mm may be about 25 µm to about 35 µm.

The method 1100 may optionally include forming the barrier reflector 112 may be formed on the housing 101 (S104b). For example, forming the barrier reflector 112 may include disposing the barrier reflector 112 using any suitable method such as depositing, coating, and/or printing a material (e.g., a metal, a metal oxide) on the housing 101. Further, the barrier reflector 112 may also be formed by bonding a film or a sheet on the housing 101. In addition, the barrier reflector 112 may be formed by any other suitable means. The barrier reflector 112 may be formed on a side of the housing 101 while being spaced apart from the LED chip 102. T The method 1100 may optionally include forming a reflector 111 (S104c). The reflector 111 may be formed over the barrier reflector 112. Forming the reflector may include similar means as described with respect to the barrier reflector 112.

The method 1100 may include mixing the sieved phosphors 107, 103, and 108 in the liquid-phase molding part 104 to manufacture the liquid-phase molding part 104 (S105). The molding part 104 may include various materials such as a resin, a hardener, or other additives in addition to the phosphors 107, 103, and 108 to form the molding part 104. For example, the molding part 104 may include at least one of silicone, epoxy, polymethyl methacrylate (PMMA), polyethylene (PE), and polystyrene (PS) in addition to the phosphors 107, 103, and 108.

Although the molding part 104 illustrated in FIG. 12 shows phosphors 103, 108, and 107, the molding part 104 may include phosphors 105 and 106. The first phosphor 105 may have the peak wavelength of the green light ranging from about 520 nm to about 570 nm and the first phosphor 103 may have the peak wavelength of the green light ranging from about 500 nm to about 570 nm. The second phosphors 106 may each have the peak wavelength of the red light ranging from about 610 nm to about 650 nm. Further, the third phosphor 107 may have the peak wavelength of the red light ranging from about 600 nm to about 670 nm.

As described above, as the particle size of the phosphor is limited, the particle size of the phosphor may be constant at a predetermined size. The light emitted from the LED chip 102 may be excited by phosphors (e.g., phosphors 105, 106, 107, 103, and 108) having the uniform particle size, thus a color coordinate distribution of light may be reduced such that the light emitted from the LED package according to an exemplary embodiment of the may have uniform quality. Further, the inlet of the needle 200 does not clog when dotting the liquid-phase molding part 104 with phosphors (e.g., phosphors 105, 106, 107, 103, and 108) of a uniform particle size at or below a predetermined size on the housing 101.

The method 1100 may also include dotting the manufactured liquid-phase molding part 104 on the housing 101 of the LED package using the needle 200 (S106). In this case, as described in other exemplary embodiments, the molding part 104 may be formed to have various shapes.

The method 1100 may further include curing the liquid-phase molding part 104 is hardened (S107). The liquid-phase molding part 104 may be cured by a variety of processes. For example, the liquid-phase molding part may be subjected to at least one of a pressure treatment, a heat treatment, and ultra violet light treatment. The manufactured LED package may be subjected a post-process (e.g., operability testing and reliability testing).

The method illustrated and describe with respect to FIGS. 11 and 12 may be applied to any of the embodiments describes with respect to FIGS. 1-10 without limitation. Although FIG. 12 and the associated description of FIGS. 11 and 12 describe sieving phosphor and forming a single molding part 104, the steps S104a, S105, S106, and S107 of method 1100 may include sieving phosphor and forming a first molding part 104b and second molding part 104a as described with respect to FIGS. 7 and 8. With respect to the exemplary embodiment described with reference to FIG. 7, second phosphors 106 may be sieved for the first molding part 104b following by manufacturing the first molding part 104b, dotting the first molding part 104b, and curing the first molding part 104b for the respective steps S104a, S105, S106, and S107 of method 1100. Then, the steps S104a, S105, S106, and S107 of method 1100 may be repeated for sieving first phosphors 105 for the second molding part 104a, manufacturing the second molding part 104a, dotting the second molding part 104a, and curing the second molding part 104a.

Similarly, with respect to the exemplary embodiment described with reference to FIG. 8, second phosphors 108 and third phosphor 107 may be sieved for the first molding part 104b following by manufacturing the first molding 104b, dotting the first molding part 104b, and curing the first molding part 104b for the respective steps S104a, S105, S106, and S107 of method 1100. Then, the steps S104a, S105, S106, and S107 of method 1100 may be repeated for sieving first phosphors 103 for the second molding part 104a, manufacturing the second molding 104a, dotting the second molding part 104a, and curing the second molding part 104a. The first molding part 104b and the second molding part 104a may be cured at the same time. It is envisioned that the first molding part 104b and the second molding part 104a may be cured at the same time for either modification.

Figure 13:
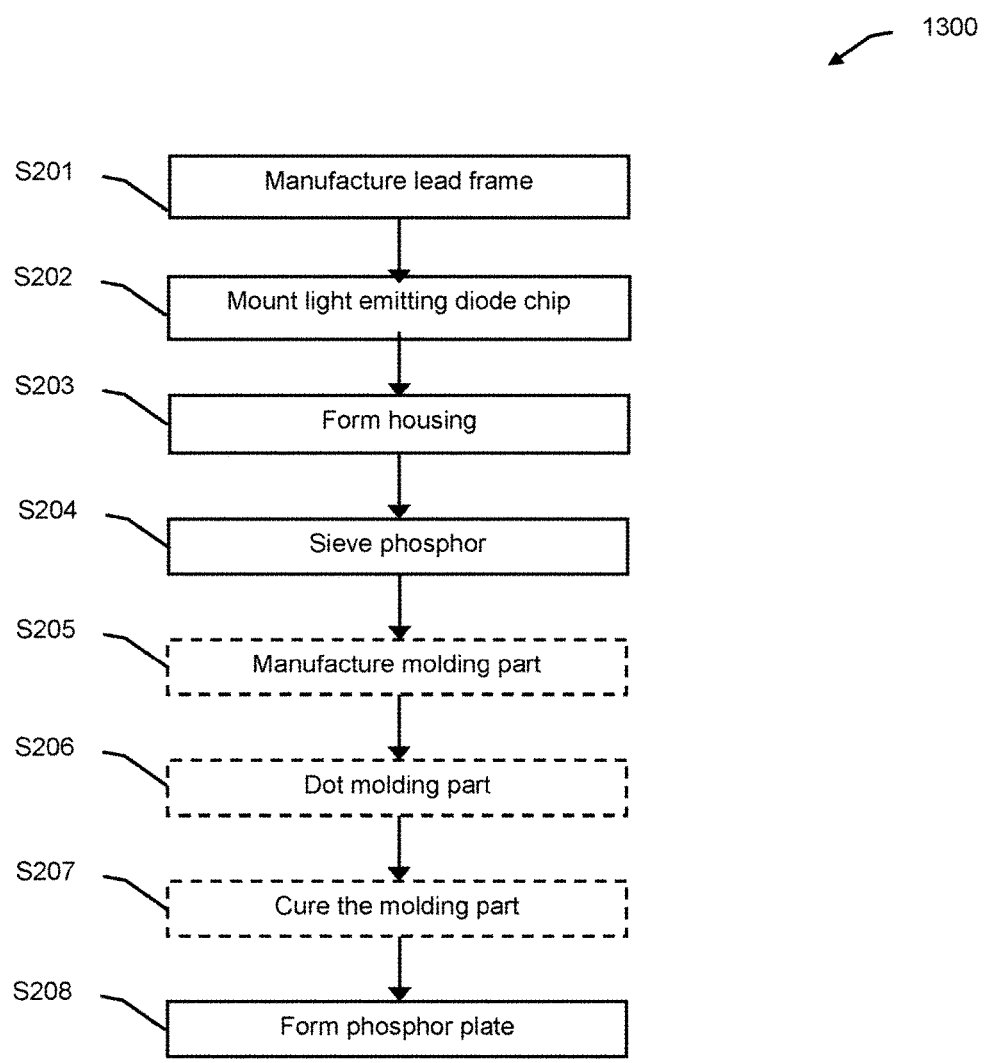
FIG. 13 is a flow chart of manufacturing method of an LED package according to an exemplary embodiment.
Figure 14A:
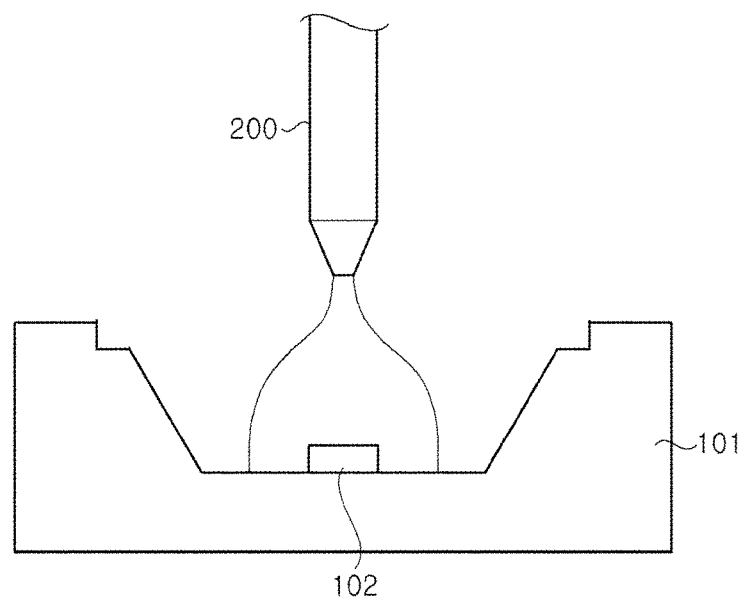
FIG. 14A a diagram of a process of dotting a molding part without a phosphor according an exemplary embodiment.
Figure 14B:
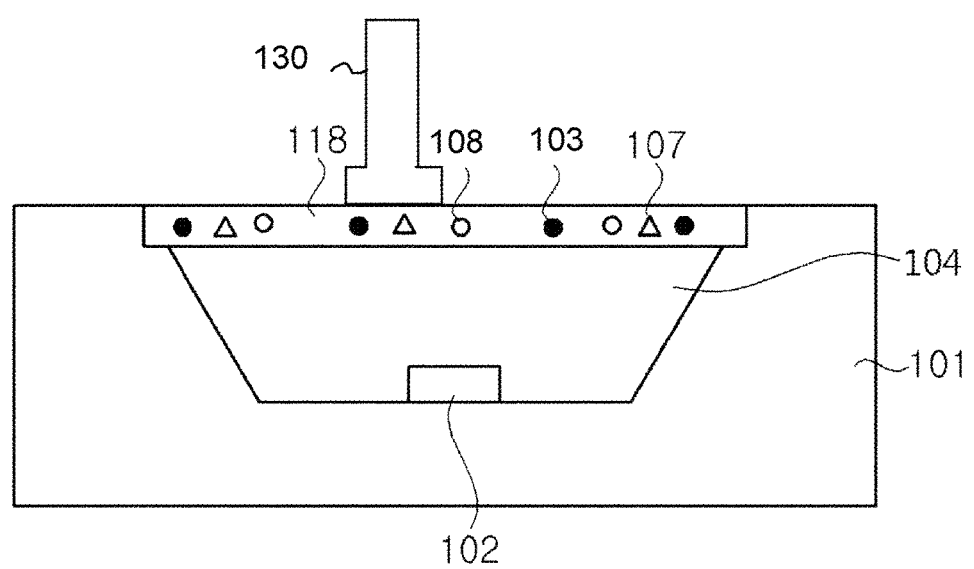
FIG. 14B is a diagram of a process of applying a phosphor plate according to an exemplary embodiment.

FIG. 13 is a flow chart of a manufacturing method 1300 of an LED package according to an exemplary embodiment. FIG. 14A is a diagram illustrating a process of dotting a molding part 104 according to an exemplary embodiment. FIG. 14B is a diagram illustrating a process of applying a phosphor plate 118 according to an exemplary embodiment. The manufacturing method 1300 of the LED package according to an exemplary embodiment will be described with reference to FIGS. 14A and 14B along with the flow chart of FIG. 13.

The manufacturing method 1300 includes the steps of manufacturing the lead frame (S201), mounting the LED chip 102 to the lead frame (S202), forming a housing 101 (S203), sieving phosphors (S204), forming a phosphor plate 118 (S208). The manufacturing method 1300 may also optionally include manufacturing a molding part 104 (S205), dotting the molding part 104 (S106), and curing the molding part 104 (S207). Steps S201, S202, S203, S204 of method 1300 are substantially similar to the respective steps S101, S102, S103a, and S104a of method 1100. Steps S205, S206, S207 of method 1300 are substantially similar to the steps of S105, S106, and S107 of method 1100, except steps S205, S206 and S207 are optional steps. These similarities in the steps are also not further described to avoid obscuring exemplary embodiment.

The method 1300 may optionally include manufacturing a liquid-phase molding part 104 without phosphors (S205). Thus, manufacturing the liquid-phase molding part 104 may be the same as that with reference to method 1100 except that the phosphors are mixed not with liquid-phase molding part 104 in method 1300. These similarities are also not further described to avoid obscuring exemplary embodiment.

The method 1300 may optionally include dotting the liquid-phase molding part 104 without phosphors (S206). As shown in FIG. 14A, the needle 200 described with reference to FIG. 12 may be used for this process. Step S206 may be substantially similar to step S106. These similarities are also not further described to avoid obscuring exemplary embodiment.

The method 1300 may optionally include curing the molding part 104 (S207). Step S207 may be substantially similar to step S107. These similarities are also not further described to avoid obscuring exemplary embodiment.

The method 1300 may further include forming the phosphor plate 118 (S208). As shown in FIG. 14B, forming the phosphor plate 118 may include mixing the sieved phosphors 107, 103, and 108 in a liquid-phase phosphor plate 118. Although not shown, forming the phosphor 118 may include mixing the sieved phosphors 105 and 106 in a liquid-phase phosphor plate 118. The phosphor plate 118 may include the same material as the molding part 104. The phosphor plate 118 may include a resin, a hardener, or other additives in addition to the phosphors 107, 103, and 108. For example, the molding part 104 may include at least one of silicone, epoxy, polymethyl methacrylate (PMMA), polyethylene (PE), and polystyrene (PS) in addition to the phosphors 107, 103, and 108.

The phosphor plate 118 may be applied by dotting with the needle 200 shown with in FIG. 14a. The phosphor plate 118 may also be cured similar to the molding part 104. Alternatively, the phosphor plate 118 may partially or fully cure prior to being disposed on the LED package. In that case the phosphor plate 118 may be applied using a mechanical arm 130 or some other tool to align the partially cured or fully cured phosphor plate 118.

According to exemplary embodiments, it is possible to provide an LED package including the phosphor emitting light having the narrow FWHM to improve the color reproduction of the LED package. Further, it is possible to prevent the deterioration phenomenon of the phosphor due to a high temperature and/or a high humidity environment, thereby improving the reliability of the phosphor and the LED package compared to the related art.

According to exemplary embodiments, the reliability of the phosphor included in the LED package may be enhanced also resulting in the reliability of the LED package being enhanced. Therefore, it is possible to minimize the change in CIE color coordinates and maintain light emitted from an LED package over a prolonged long period when compared to the related art.

According to exemplary embodiments, the phosphor included in the LED package may emit the green light and/or the red light having the narrow FWHM thereby enhancing the color reproduction of the LED package when compared to the related art.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A light-emitting diode package, comprising:
a light-emitting diode chip disposed in a housing;
a first phosphor configured to emit green light; and
a second phosphor configured to emit red light,
wherein:
a white light is configured to be formed by a synthesis of light emitted from the light-emitting diode chip, the first phosphor, and the second phosphor;

the light-emitting diode chip comprises at least one of a blue light-emitting diode chip having a Full Width at Half Maximum (FWHM) less than or equal to about 40 nm;

the second phosphor has a chemical formula of $A_2MF_6$:$Mn^{4+}$, A is one of Li, Na, K, Rb, Ce, and $NH_4$, and M is one of Si, Ti, Nb, and Ta; and $Mn^{4+}$ of the second phosphor has a mole range of about 0.02 to about 0.035 times the M.

2. The light-emitting diode package of claim 1, wherein:
the white light has an x color coordinate and a y color coordinate forming a point present in a region on an International Commission on Illumination (CIE) chromaticity diagram; and
the x color coordinate is about 0.25 to about 0.32 and the y color coordinate is about 0.22 to about 0.32.

3. The light-emitting diode package of claim 1, wherein a change rate of a light emitting intensity of the white light is about 5% or less.

4. The light-emitting diode package of claim 1, wherein a size of a peak wavelength of the green light is about 20% to about 35% a peak wavelength of the red light.

5. The light-emitting diode package of claim 1, wherein the white light has national television system committee National Television System Committee (NTSC) color saturation which is more than or equal to about 85%.

6. A light-emitting diode package, comprising:
a light-emitting diode chip disposed in a housing;
a first phosphor configured to emit green light; and
a second phosphor configured to emit red light,
wherein:
the light-emitting diode chip comprises at least one of a blue light-emitting diode chip having a Full Width at Half Maximum (FWHM) less than or equal to about 40 nm;
the second phosphor is a nitride-based phosphor and includes at least one of $MSiN_2$, $MSiON_2$, and $M_2Si_5N_8$ and M is one of Ca, Sr, Ba, Zn, Mg, and Eu; and
a white light is configured to be formed by a synthesis of light emitted from the light-emitting diode chip, the first phosphor, and the second phosphor.

7. The light-emitting diode package of claim 6, wherein the first phosphor comprises at least one of a Ba—Al—Mg (BAM)-based phosphor, a quantum dot phosphor, a silicate-based phosphor, a beta-SiAlON-based phosphor, a Garnet-based phosphor, and an LSN-based phosphor.

8. The light-emitting diode package of claim 6, wherein the light-emitting diode chip further comprises an ultraviolet light-emitting diode chip.

9. The light-emitting diode package of claim 6, wherein a peak wavelength of the green light of the first phosphor comprises a range from about 520 nm to 570 nm, and
wherein a peak wavelength of the red light of the second phosphor comprises a range from about 610 nm to about 650 nm.

10. A light-emitting diode package, comprising:
a light-emitting diode chip disposed in a housing;
a first phosphor configured to emit green light;
a second phosphor configured to emit red light;
a third phosphor configured to emit red light; and
wherein:
the first, second, and third phosphors are disposed in a molding part;
the light-emitting diode chip comprises at least one of a blue light-emitting diode chip having a Full Width at Half Maximum (FWHM) less than or equal to about 40 nm;
one of the red light phosphors is a nitride-based phosphor and includes at least one of $MSiN_2$, $MSiON_2$, and $M_2Si_5N_5$ and M is one of Ca, Sr, Ba, Zn, Mg, and Eu;
the red light of the second phosphor and the red light of the third phosphor have different peak wavelengths in which one of peak wavelength of the red light phosphor comprises a range from about 610 nm to about 650 nm and the other peak wavelength of the red light phosphor comprises a range from about 600 nm to 670 nm, and
a white light is configured to be formed by a synthesis of light emitted from the light-emitting diode chip, the first phosphor, and the second phosphor.

11. The light-emitting diode package of claim 10, wherein the housing includes a top surface opposite a bottom surface and the top surface of the housing includes a lower portion, an upper portion and an intermediate portion between the lower portion and the upper portion; and the light-emitting diode chip, the first phosphor, the second phosphor, the third phosphor and the molding part are disposed on the lower portion and the intermediate portion of the top surface of the housing.

12. The light-emitting diode package of claim 10, wherein the housing further comprises a reflector disposed on a side of the housing and being spaced apart from the LED light-emitting diode chip.

13. The light-emitting diode package of claim 10, wherein the first phosphor comprises at least one of a Ba—Al—Mg (BAM)-based phosphor, a quantum dot phosphor, a silicate-based phosphor, a beta-SiAlON-based phosphor, a Garnet-based phosphor, and an LSN-based phosphor.

14. The light-emitting diode package of claim 10, wherein the second phosphor is a fluoride-based phosphor and the third phosphor is a nitride-based phosphor.

15. The light-emitting diode package of claim 14, wherein the third phosphor has a mass range of about 0.1 wt % to about 10 wt % with respect to the second phosphor.

16. The light-emitting diode package of claim 15, wherein the fluoride-based phosphor has a chemical formula of $A_2MF_6$:$Mn^{4+}$, A is one of Li, Na, K, Rb, Ce, and $NH_4$, and M is one of Si, Ti, Nb, and Ta.

17. The light-emitting diode package of claim 16, wherein the $Mn^{4+}$ of the fluoride-based phosphor has a mole range of about 0.02 to about 0.035 times the M.

* * * * *